United States Patent [19]

Kobayashi et al.

[11] Patent Number: 4,737,810
[45] Date of Patent: Apr. 12, 1988

[54] PHOTOSENSITIVE MATERIAL DEVELOPING APPARATUS

[75] Inventors: Kesanao Kobayashi; Hisao Ohba, both of Shizuoka, Japan

[73] Assignee: Fuji Photo Film Co., Ltd., Kanagawa, Japan

[21] Appl. No.: 901,503

[22] Filed: Aug. 28, 1986

[30] Foreign Application Priority Data

Sep. 10, 1985 [JP] Japan .................. 60-200067

[51] Int. Cl.[4] .............................................. G03D 5/04
[52] U.S. Cl. ...................... 354/299; 354/317; 354/325; 118/119; 118/325
[58] Field of Search ............ 354/299, 317, 318, 319, 354/320, 324, 325, 326; 118/119, 325, 326

[56] References Cited

U.S. PATENT DOCUMENTS

| | | | |
|---|---|---|---|
| 3,635,144 | 1/1972 | Beck | 354/317 |
| 3,714,882 | 2/1973 | Schranz et al. | 118/119 |
| 4,145,135 | 3/1979 | Sara | 354/324 |
| 4,215,927 | 8/1980 | Grant et al. | 118/119 |
| 4,327,987 | 5/1982 | Friar et al. | 354/317 |

Primary Examiner—A. A. Mathews
Attorney, Agent, or Firm—Sughrue, Mion, Zinn, Macpeak, and Seas

[57] ABSTRACT

A photosensitive material developing apparatus has a first area for supplying a developer to the exposed surface of an imagewise light-exposed photosensitive material, and a second area positioned on the downstream side of the first area in the direction in which the photosensitive material is transported, and adapted to develop the photosensitive material. The apparatus is provided with a wire bar having a wire wound on the outer peripheral portion thereof for the purpose of removing a part of the developer supplied to the exposed surface of the photosensitive material before development is practically commenced and of allowing only a predetermined amount of developer to remain on the exposed surface. The apparatus is further provided with a tray for collecting the removed developer, and a pump for delivering the collected developer to the first area so as to be reused. Accordingly, it is possible to eliminate the fear of the photosensitive material being processed by the fatigued developer, and reduce the amount of consumption of the disposable developer.

28 Claims, 2 Drawing Sheets

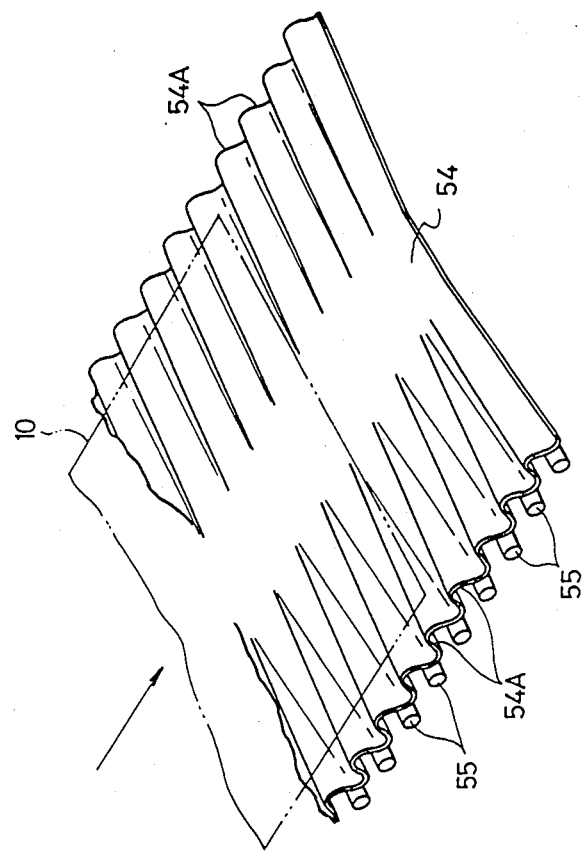

PHOTOSENSITIVE MATERIAL DEVELOPING APPARATUS

BACKGROUND OF THE INVENTION

1. Field of the Invention

The present invention relates to a photosensitive material developing apparatus for developing an imagewise exposed photosensitive material by means of a developer. More particularly, the present invention pertains to a photosensitive material developing apparatus which is most suitable for producing lithographic printing plates.

2. Description of the Related Art

A typical conventional automatic developing machine for processing a multiplicity of lithographic printing plates has heretofore been arranged such that a photosensitive material is transported through a plurality of pairs of rollers while being clamped thereby, and in the course of the transportation, a developer is applied to the surface of the imagewise exposed light-sensitive layer of the photosensitive material (herein after refers to as "the exposed surface of the photosensitive material") to conduct a developing operation. This developer is applied to the exposed surface by a spray or other similar means so as to dissolve or swell either the exposed area or the non-exposed area, and then brushed off.

The developer which has already been used for the developing operation is generally recirculated for reuse. During such repetitive use of the developer, however, a component in the photosensitive layer of the photosensitive material dissolves out and consumes an effective component in the developer, thus causing the developer to be fatigued and thereby deteriorated. In addition, when the developer is alkaline, it gradually absorbs carbon dioxide gas in the air as time goes by, so that the developer is neutralized little by little to lower the alkaline strength, resulting in fatigue with age, and thus causing the developer to be deteriorated.

To relieve a developer of such fatigue, means have already been proposed wherein the fatigue is relieved by supplying a developing replenisher either continuously or intermittently in accordance with the amount by which the developer is used up for development, such as those disclosed in the specifications of Japanese Patent Laid-Open No. 144,502/1975, U.S. Pat. No. 4,259,434 and British Pat. No. 2,046,931. These prior arts suffer, however, from the problem that the composition of the developer becomes slightly different from that in a previous developing operation, which means that photosensitive materials which are, strictly speaking, different from each other in terms of performance are produced for each time.

For this reason, a means wherein a developer which has already been used for development is not reused but disposed has been contrived. This prior art, however, needs a relatively large amount of developer and is therefore uneconomical. Further, there has been still another known means wherein the amount of developer used is reduced, and the developer remaining on the exposed area is removed by rubbing the photosensitive material with a brush or a sponge. However, this prior art also suffers from the problems that development cannot satisfactorily be effected, and the matter to be printed is liable to be stained during printing.

SUMMARY OF THE INVENTION

In view of the above-described circumstances, it is a primary object of the present invention to provide a photosensitive material developing apparatus which enables a stable developing operation to be carried out at all times without any fear of a photosensitive material being processed by a fatigued developer and which permits a reduction in the amount of consumption of a disposable developer.

To this end, the present invention provides a photosensitive material developing apparatus for developing a photosensitive material while transporting the same, which comprises: a first area for supplying a developer to the exposed surface of the photosensitive material; measuring means adapted to remove a part of the developer supplied to the exposed surface of the photosensitive material and allow only a predetermined amount of developer to remain on the exposed surface; a second area positioned on the downstream side of the first area in the direction in which the photosensitive material is transported, and adapted to develop the photosensitive material by means of the predetermined amount of developer remaining on the exposed surface; and circulating means for supplying the developer, which has been supplied to the exposed surface in the first area and removed therefrom by the measuring means, to the first area again.

In the first area where a relatively large amount of developer is supplied, the measuring means removes the greater part of the developer and allows only a predetermined amount of developer to remain on the exposed surface of the photosensitive material. The length of the first area along the traveling direction is so set that development effected by the developer is not commenced within this area and the supplied developer can spread over the whole area of this portion, VIZ. the area between roll 20 and wire bar 22 of the photosensitive material. Accordingly, the developer which is removed in the first area has not yet become fatigued, and it is therefore possible to recirculate this developer so as to be reused.

The photosensitive material which has passed through the measuring means to enter the second area is developed by the predetermined amount of developer which is allowed to remain on the exposed surface by the measuring means. The developer which has been used for development in the second area has already become fatigued through the developing process and the contact with the atmospheric air, and is therefore disposed.

Thus, the developer recirculated in the first area is not fatigued, while the developer used for development in the second area is disposed, and the developer which has not yet become fatigued is therefore supplied to the photosensitive material at all times, which means that a stable developing operation can be conducted at all times. Since the amount of the developer disposed in the second area is much smaller than that of the developer which is supplied in the first area, the amount of consumption of the developer is reduced as a whole.

As the measuring means, it is possible to employ various types of measuring means such as a wire bar formed by winding a thin wire having a predetermined diameter around a shaft, a grooved roller, or a blade.

BRIEF DESCRIPTION OF THE DRAWINGS

FIG. 2 is a perspective view showing the relationship between a guide plate and heater elements, which are employed in the embodiment.

DESCRIPTION OF THE PREFERRED EMBODIMENT

Figure 1:
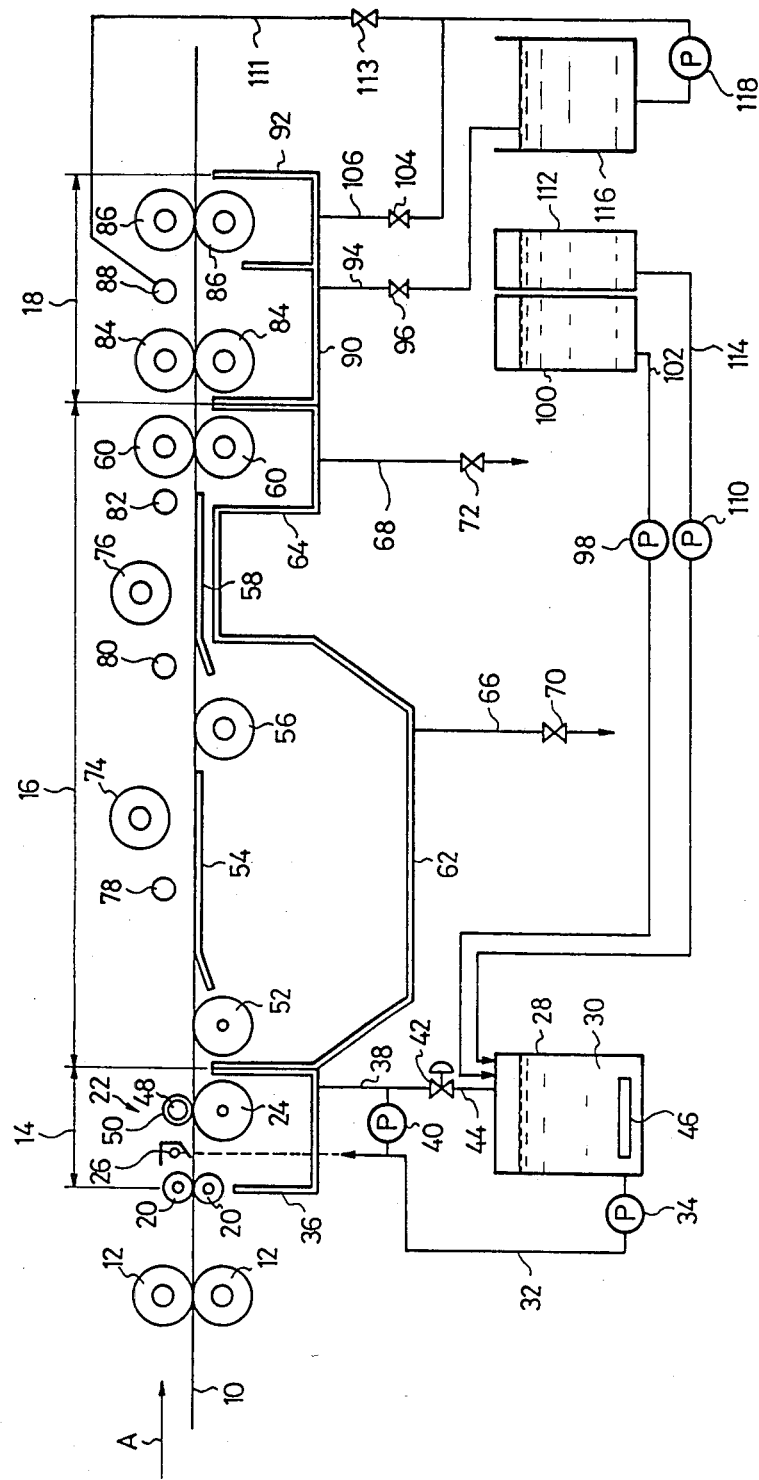
FIG. 1 is a vertical sectional view of one embodiment of the photosensitive material developing apparatus according to the present invention.

The present invention will be described hereinunder in detail with reference to the accompanying drawings.

FIG. 1 shows one embodiment of the photosensitive material developing apparatus according to the present invention.

In this apparatus, a printing plate 10 which has already been subjected to imagewise light-exposure is transported in the direction of the arrow A so as to be developed The printing plate 10 is clamped by a pair of guide rollers 12 so as to be sequentially fed through a first area 14, a second area 16 and a third area 18, and it is thereby automatically developed.

In the first area 14, a pair of guide rollers 20 clamp the printing plate 10 to feed it into the gap defined between a wire bar 22 and a guide roller 24 which is contacted by the wire bar 22 so that the printing plate 10 is clamped therebetween.

In this first area 14, a spray 26 which defines developer supply means is disposed on the immediately downstream side of the guide rollers 20 in the direction in which the printing plate 10 is transported, so that a developer 30 contained in a stock tank 28 is supplied to the exposed surface of the printing plate 10 through a pipe 32 and a pump 34 provided in the intermediate portion of the pipe 32.

A tray 36 is disposed in the lower part of the first area 14 for collecting the developer 30 which is removed from the printing plate 10 passing through the first area 14. The developer 30 collected in the tray 36 is supplied to a pump 40 through a pipe 38 so as to be recirculated to the spray 26. When an aqueous alkali metal silcate solution is used as the developer of a positive working presensitized plate, the $SiO_2/M_2O$ molar ratio of this developer 30 is preferably 1.2 or less from the viewpoint of developability.

A pipe 44 is communicated with the pipe 38 through a valve 42, so that, when an operation is completed, the developer 30 collected in the tray 36 is returned to the stock tank 28. In addition, a heater 46 is provided in the stock tank 28 so as to maintain the developer 30 at a predetermined temperature.

The wire bar 22 is formed in such a manner that a wire 50 having a predetermined diameter is spirally and tightly wound around a shaft 48, and the gap which is defined between the outer periphery of the wire 50 and that of the guide roller 24 is adapted to measure the amount of the developer 30 applied to the surface of the printing plate 10. More specifically, when the printing plate 10 is delivered to the second area 16 while being clamped between the wire bar 22 and the guide roller 24, only a predetermined amount of developer 30 (a liquid film thickness of 300um or less) is allowed to remain on the exposed surface of the printing plate 10 by the action of the measuring means, and the rest of the developer 30 is removed and dropped into the tray 36.

The length of the first area 14 is so set that the developer 30 which is applied to the exposed surface of the printing plate 10 cannot commense to develop the exposed surface before it reaches the wire bar 22 and, at the same time, the applied developer 30 can spread over the whole area on the printing plate 10 in the lateral direction thereof (perpendicular to the direction in which the printing plate 10 is transported) between roll 20 and wire bar 22 before the developer-coated portion of the printing plate 10 reaches the wire bar 22.

A loss in amount of the developer 30 in the stock tank 28 is filled up with replenishing water and replenishing developer which are delivered to the stock tank 28 from a replenishing water tank 100 and a replenishing developer tank 112 through pumps 98 and 110, respectively, in such a manner that the developer 30 in the tank 28 is maintained at a predetermined concentration.

In the second area 16, the printing plate 10 which is transported from the first area 14 is guided by a guide roller 52 so as to be mounted on a guide plate 54 and is then guided by a guide roller 56 so as to be mounted on a guide plate 58 before being fed into the gap defined between a pair of squeeze rollers 60.

A tray 62 is disposed below the guide roller 52 and the guide plate 54, and a tray 64 is disposed below the squeeze rollers 60. Pipes 66 and 68 are respectively communicated with the trays 62 and 64 so that the developer 30 having been used for development and collected in the trays 62 and 64 can be discarded by opening valves 70 and 72, respectively.

Brush rollers 74 and 76 which are movable up and down are disposed above the guide plates 54 and 58, respectively, so that the brush rollers 74 and 76 are moved toward the guide plates 54 and 56, respectively, according to need, and rotated to rub the printing plate 10 mounted on the guide plates 54 and 58, thereby allowing removal of the light-sensitive layer in the non-image areas to complete the development. The brush rollers 74 and 76 may be provided according to need.

Sprays 78 and 80 are disposed on the upstream side of the brush rollers 74 and 76, respectively, so that it is possible to wash the brush rollers 74 and 76 according to need.

In addition, a spray 82 is provided on the upstream side of the squeeze rollers 60 so that it is possible to wash the rollers 60.

FIG. 2 shows the guide plate 54 in detail. A plurality of heater elements 55 are disposed underneath the guide plate 54 in such a manner that the longitudinal axis of each heater element 55 extends perpendicularly to the direction in which the printing plate 10 is transported. These heater elements 55 are provided in order to heat the developer 30 coated on the printing plate 10 moving on the guide plate 54 for the purpose of improving the developing efficiency. The developer 30 is heated to 25° to 35° C. by the heater elements 55. The developer 30, when heated in this way, is concentrated through evaporation, but no problem arises even when scale is produced in the developer 30 concentrated through evaporation after it has been used to develop the printing plate 10 since the developer 30 in the second area 16 is disposed. It is therefore possible, in this embodiment, to heat the developer 30 to a temperature of 40° to 50° C. and thereby to further improve the developing efficiency.

When the printing plate 10 is an aluminum plate, it is easy for the heater elements 55 to raise the temperature of the developer 30 on the plate 10 since the specific heat of aluminum is relatively small.

The guide plate 54 has a corrugated portion 54A formed at each of the lateral edge portions. The depth of the corrugations is gradually increased toward the lateral edges of the guide plate 54. Thus, the developer 30 dropping from the printing plate 10 is allowed to be reliably moved in the lateral direction of the guide plate 54 and effectively dropped therefrom without any fear of the developer 30 attaching to the heater elements 55. It should be noted that it is even more effective practice to dispose the heater elements 55 so as to be respectively positioned under the projections of the corrugated portions 54A.

In place of the heater elements 55, it is possible to employ a lattice-type heater, a panel heater, a high-frequency heater, an electromagnetic induction heater, a ceramics heater, etc., and the heater employed may be provided on the upper side of the printing plate 10. In such case, a far infrared heater may be provided in such a manner as to be slightly spaced away from the printing plate 10.

It should be noted that the guide plate 58 shown in FIG. 1 may also have an arrangement similar to that of the guide plate 54 and may be provided with a heater.

The developed printing plate 10 is then sent out from the second area 16 to the third area 18 through the squeeze rollers 60 where it undergoes a finishing treatment. In the third area 18, the printing plate 10 is transported between pairs of guide rollers 84 and 86, and a spray nozzle 88 is disposed at a position intermediate between these pairs of guide rollers 84 and 86, whereby it is possible to subject the passing printing plate 10 to a finishing treatment.

Trays 90 and 92 are disposed in the lower part of the third area 18. The tray 90 is connected to a stock tank 116 by a pipe 94 through a valve 96.

The tray 92 is connected to the stock tank 116 by a pipe 106 through a valve 104 and a pump 118. This pump 118 is also adapted to deliver a finishing agent contained in the stock tank 116 to the spray nozzle 88 through a pipe 111 and a valve 113.

It should be noted that a pipe 114 which extends from the replenishing developer tank 112 and has a pump 110 at intermediate portion thereof is connected to the stock tank 28.

In addition, the guide rollers and squeeze rollers which are provided along the transporting path of the printing plate 10 in the above-described arrangement are adapted to rotated by the driving force from drive means (not shown).

The following is a description of the operation of this embodiment.

The printing plate 10 which has already been subjected to imagewise light exposure is transported in the direction of the arrow A to enter the first area 14 through the pairs of guide rollers 12 and 20. In the first area 14, the developer 30 is applied to the printing plate 10 by the spray 26. Since the length of the first area 14 is short, the greater part of the applied developer 30 is removed by the wire bar 22 before developing the exposed surface of the printing plate 10. Accordingly, although the removed developer 30 is recirculated to the spray 26 through the pipe 38, the pump 40 and the pipe 32 so as to be applied to the printing plate 10, this reused developer 30 has not yet become fatigued.

Since the recirculated developer 30 also has a relatively small area of contact with the atmospheric air, the fatigue with age as a result of absorption of carbon dioxide gas is correspondingly small.

The wire bar 22 may be rotated, but even when it is at rest, the measuring operation can effectively be performed.

In addition, since the length of the first area 14 is so set that the developer 30 which is applied from the spray 26 can spread over the whole area of this portion of the printing plate 10 in the lateral direcion thereof before it reaches the wire bar 22, the printing plate 10 fed out from the gap between the wire bar 22 and the guide roller 24 has the developer 30 coated on the whole area of the surface thereof, the developer 30 having a uniform thickness measured by the wire bar 22.

It should be noted that, when the trailing end of the printing plate 10 is detected by a sensor (not shown), the supply of the developer 30 from the spray nozzle 26 is suspended.

While the printing plate 10 is being moved through the second area 16, from the guide roller 52 to the squeeze rollers 60, development gradually progresses on the printing plate 10.

The time required for the printing plate 10 to reach the squeeze rollers 60 can be adjusted as desired by controlling the rotational speed of each of the guide rollers.

Since the guide plate 54 is provided with the heater elements 55 so as to heat the developer 30 on the printing plate 10, the developing efficiency is particularly increased. Although the developer 30 thus heated is very fatigued, no problem arises since the developer 30 in the second area 16 is disposed.

In this embodiment, the guide roller 56 is provided in the central portion of the second area 16, and the developer 30 is removed by this guide roller 56 to a certain extent and allowed to drop into the tray 62. The developer 30 collected in the tray 62 is discharged through the pipe 66 and the valve 70.

The developer 30 on the printing plate 10 which is further moved forward is reliably removed by the pair of squeeze rollers 60 and allowed to drop into the tray 64. The developer 30 collected in the tray 64 is discharged through the pipe 68 and the valve 72.

The squeeze rollers 60 are maintained in a clean state by virtue of the washing water which is sprayed from a shower 82 either according to need or at all times. Thus, it is possible to ensure reliable removal of the developer 30 from the printing plate 10, and the printing plate 10 having no residual developer 30 is delivered to the third area 18.

The developer 30 which is discharged through the pipes 66 and 68 has already become fatigued through the developing process. However, since this developer 30 is disposed, there is no fear of the fatigued developer 30 being recirculated to the spray 26.

Thus, in the second area 16 the printing plate 10 is stably developed by the developer 30 which has been applied thereto in the first area 14 and which has not yet become fatigued, and this developer 30 has accurately been measured by virtue of the wire bar 22. It is therefore possible to effect a highly accurate developing operation.

The printing plate 10 is then fed out from the squeeze rollers 60 to enter the third area 18 where it is processed by a finishing agent sprayed from the spray nozzle 88 and the finishing agent is removed by the pair of guide rollers 86, thus completing the developing process.

In the third area 18, desensitization and washing are carried out according to need.

As has been described above, the photosensitive material developing apparatus according to the present invention comprises: a first area for supplying a developer to the exposed surface of a photosensitive material; measuring means adapted to remove the supplied developer while allowing only a predetermined amount of developer to remain on the exposed surface of the photosensitive material; a second area adapted to develop the photosensitive material by means of the predetermined amount of developer remaining on the exposed surface; and circulating means for supplying the developer, which has been supplied to the exposed surface in the first area and removed therefrom by the measuring means, to the first area again. It is therefore possible to eliminate the fear of the photosensitive material being processed by the fatigued developer, allow a stable developing operation to be conducted, and reduce the amount of consumption of the developer.

What is claimed is:

1. A photosensitive material developing apparatus for developing an imagewise light-exposed photosensitive material while transporting the material which comprises:
   (a) a first area including means for supplying a developer to an exposed surface of said photosensitive material;
   (b) measuring means disposed in said first area and adapted to remove a part of the developer supplied to the exposed surface of the photosensitive material and allow only a predetermined amount of developer to remain on said exposed surface;
   (c) a second area positioned downstream from said first area in the direction in which said photosensitive material is transported, wherein said photosensitive material is developed by means of said predetermined amount of developer remaining on the exposed surface;
   (d) recirculating means for recovering the developer which has been supplied to said exposed surface in said first area and removed therefrom by said measuring means, and recirculating the developer to said supplying means again; and
   (e) means for collecting the developer which has been contaminated by the development of the photosensitive material in the second area and disposing of the developer.

2. A photosensitive material developing apparatus according to claim 1, wherein said first area includes developer supply means for supplying the developer to the exposed surface of said photosensitive material, and said measuring means disposed on the downstream side of said developer supply means in the photosensitive material transporting direction.

3. A photosensitive material developing apparatus according to claim 2, wherein said first area further includes a first tray which is disposed in the lower part thereof and adapted to collect the developer removed from said exposed surface.

4. A photosensitive material developing apparatus according to claim 3, wherein said circulating means includes a pipe connected to said tray, and a pump adapted to deliver the developer removed from said exposed surface to said developer supply means through said pipe.

5. A photosensitive material developing apparatus according to claim 4, wherein the distance between the position at which the developer is supplied to the exposed surface of said photosensitive material by said developer supply means and the position at which the developer is removed from said exposed surface by said measuring means is so set that the developer supplied to said exposed surface cannot commence to develop said exposed surface before it reaches said measuring means.

6. A photosensitive material developing apparatus according to claim 5, wherein said second area includes a guide plate adapted to support the lower surface of said photosensitive material.

7. A photosensitive material developing apparatus according to claim 6, wherein said guide plate is provided with a plurality of heater elements disposed on the lower side thereof in such a manner that the longitudinal axis of each heater element extends perpendicularly to the photosensitive material transporting direction, so that the developer supplied to the exposed surface of said photosensitive material is heated when said photosensitive material is transported on said guide plate.

8. A photosensitive material developing apparatus according to claim 7, wherein said guide plate is corrugated at both edge portions in the direction of the axis thereof which is perpendicular to the photosensitive material transporting direction, and the depth of the corrugations is gradually increased toward said edge portions, so that the developer dropping from said photosensitive material onto said guide plate is reliably moved toward said edge portions, and there is therefore no fear of said developer attaching to said heater elements.

9. A photosensitive material developing apparatus according to claim 8, wherein said second area further includes a pair of squeeze rollers provided on the downstream side of said guide plate in the photosensitive material transporting direction so that the developer remaining on said photosensitive material is removed by said squeeze rollers.

10. A photosensitive material developing apparatus according to claim 9, wherein said second area further includes a sprayer for applying a washing liquid to said squeeze rollers so as to be washed thereby.

11. A photosensitive material developing apparatus according to claim 10, wherein said means for collecting the developer includes second and third trays respectively disposed below said guide plate and said squeeze rollers so that the developer dropping from said guide plate and that from said squeeze rollers are respectively collected in said second and third trays and then discharged therefrom.

12. A photosensitive material developing apparatus according to claim 11, wherein said measuring means includes a wire bar composed of a shaft and a wire which has a predetermined diameter and which is spirally and tightly wound around said shaft.

13. A photosensitive material developing apparatus according to claim 12, wherein said measuring means further includes a guide roller which cooperates with said wire bar to clamp said photosensitive material so as to deliver it to said second area.

14. A photosensitive material developing apparatus according to claim 13, further comprising a third area provided adjacent to said second area and on the downstream side of said squeeze rollers in the photosensitive material transporting direction, said third area being adapted to subject the developed photosensitive material to a finishing treatment.

15. A photosensitive material developing apparatus according to claim 14, wherein said third area includes a spray nozzle for supplying a finishing agent to said photosensitive material.

16. A photosensitive material developing apparatus employed to develop an imagewise light-exposed photosensitive material by means of a developer while transporting said material, which comprises:
   (a) a first area having developer supply means for supplying the developer to an exposed surface of said photosensitive material;
   (b) measuring means provided in said first area and on a downstream side of said developer supply means in the direction in which the photosensitive material is transported, said measuring means being adapted to remove a part of the developer supplied to the exposed surface of said photosensitive material and allow only a predetermined amount of a developer to remain on said exposed surface;
   (c) a stock tank adapted to contain the developer and deliver the developer to said developer supply means through pump means;
   (d) a second area positioned adjacent to and on the downstream side of said first area in the photosensitive material transporting direction, said second area being adapted to develop said photosensitive material by means of said predetermined amount of developer remaining on said exposed surface;
   (e) recirculating means for recovering the developer which has been supplied to the exposed surface in said first area and removed therefrom by said measuring means, and recirculating the developer to said developer supply means again;
   (f) means for collecting the developer which has been contaminated by the development of the photosensitive material in the second area and disposing of the developer; and
   (g) a third area positioned adjacent to and on a downstream side of said second area in the photosensitive material transporting direction and adapted to subject the developed photosensitive material to a finishing treatment.

17. A photosensitive material developing apparatus according to claim 16, wherein said first area further includes a first tray which is disposed in the lower part thereof and adapted to collect the developer removed from said exposed surface.

18. A photosensitive material developing apparatus according to claim 17, wherein said circulating means includes a pipe connected to said tray, and a pump adapted to deliver the developer removed from said exposed surface to said developer supply means through said pipe.

19. A photosensitive material developing apparatus according to claim 18, wherein the distance between the position at which the developer is supplied to the exposed surface of said photosensitive material by said developer supply means and the position at which the developer is removed from said exposed surface by said measuring means is so set that the developer supplied to said exposed surface cannot commence to develop said exposed surface before it reaches said measuring means.

20. A photosensitive material developing apparatus according to claim 19, wherein said second area includes a guide plate adapted to support the lower surface of said photosensitive material.

21. A photosensitive material developing apparatus according to claim 20, wherein said guide plate is provided with a plurality of heater elements disposed on the lower side thereof in such a manner that the longitudinal axis of each heater element extends perpendicularly to the photosensitive material transporting direction, so that the developer supplied to the exposed surface of said photosensitive material is heated when said photosensitive material is transported on said guide plate.

22. A photosensitive material developing apparatus according to claim 21, wherein said guide plate is corrugated at both edge portions in the direction of the axis thereof which is perpendicular to the photosensitive material transporting direction, and the depth of the corrugations is gradually increased toward said edge portions, so that the developer dropping from said photosensitive material onto said guide plate reliably moved toward said edge portions, and there is therefore no fear of said developer attaching to said heater elements.

23. A photosensitive material developing apparatus according to claim 22, wherein said second area further includes a pair of squeeze rollers provided on the downstream side of said guide plate in the photosensitive material transporting direction so that the developer remaining on said photosensitive material is removed by said squeeze rollers.

24. A photosensitive material developing apparatus according to claim 23, wherein said second area further includes a sprayer for applying a washing liquid to said squeeze rollers so as to be washed thereby.

25. A photosensitive material developing apparatus according to claim 24, wherein said second area further includes second and third trays respectively disposed below said guide plate and said squeeze rollers so that the developer dropping from said guide plate and that from said squeeze rollers are respectively collected in said second and third trays and then discharged therefrom.

26. A photosensitive material developing apparatus according to claim 25, wherein said measuring means includes a wire bar composed of a shaft and a wire which has a predetermined diameter and which is spirally and tightly wound around said shaft.

27. A photosensitive material developing apparatus according to claim 26, wherein said measuring means further includes a guide roller which cooperates with said wire bar to clamp said photosensitive material so as to deliver it to said second area.

28. A photosensitive material developing apparatus according to claim 27, wherein said third area includes a spray nozzle for supplying a finishing agent to said photosensitive material.

* * * * *